(12) United States Patent
He et al.

(10) Patent No.: US 11,370,210 B2
(45) Date of Patent: Jun. 28, 2022

(54) BOX FOR LOADING A FILM AND METHOD FOR LOADING A FILM (71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bin He, Beijing (CN); Xiangnan Wang, Beijing (CN); Haitao Yi, Beijing (CN); Haoyun Luo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 361 days.

(21) Appl. No.: 16/389,207

(22) Filed: Apr. 19, 2019

(65) Prior Publication Data
US 2020/0079069 A1 Mar. 12, 2020

(30) Foreign Application Priority Data
Sep. 11, 2018 (CN) .......................... 201811054033.9

(51) Int. Cl.
*B32B 37/18* (2006.01)
*B32B 37/00* (2006.01)
(Continued)

(52) U.S. Cl.
CPC ........ *B32B 37/182* (2013.01); *B32B 37/0046* (2013.01); *B65D 25/10* (2013.01);
(Continued)

(58) Field of Classification Search
CPC .... B65D 25/10; B65D 85/671; B32B 37/182; B32B 37/0046; B32B 2307/584;
(Continued)

(56) References Cited

U.S. PATENT DOCUMENTS 2,519,662 A * 8/1950 Kempken ............... F41C 33/06
206/317
2,822,921 A * 2/1958 Wilson ................... B65D 85/48
206/451
(Continued)

FOREIGN PATENT DOCUMENTS

CN 203526832 U 4/2014
CN 104159831 A 11/2014
(Continued)

OTHER PUBLICATIONS

First Office Action for CN Appl. No. 201811054033.9, dated Aug. 5, 2019.

*Primary Examiner* — Chun Hoi Cheung
*Assistant Examiner* — Brijesh V. Patel
(74) *Attorney, Agent, or Firm* — The Webb Law Firm (57) ABSTRACT

The present disclosure provides a box for loading a film and a method for loading a film. The box includes: a base provided with a level adjuster and a lower buffer member supported by the level adjuster. The method includes: adjusting the level adjuster such that a levelness of the lower buffer member is within an allowable range; and loading the film on the lower buffer member after adjusting the level adjuster.

13 Claims, 3 Drawing Sheets (51) Int. Cl.
*B65D 81/07* (2006.01)
*B65D 25/10* (2006.01)
*G02B 5/30* (2006.01)
*H01L 51/00* (2006.01)
*H01L 51/56* (2006.01)

(52) U.S. Cl.
CPC ........ *B65D 81/07* (2013.01); *B32B 2307/584* (2013.01); *B32B 2457/206* (2013.01); *G02B 5/30* (2013.01); *H01L 51/003* (2013.01); *H01L 51/0097* (2013.01); *H01L 51/56* (2013.01); *H01L 2251/5338* (2013.01)

(58) Field of Classification Search
CPC ... B32B 2457/206; G02B 5/30; H01L 51/003; H01L 51/0097; H01L 51/56; H01L 2251/5338
USPC ............. 206/316.1, 521, 583–594, 557, 449, 206/453–455
See application file for complete search history.

(56) References Cited

U.S. PATENT DOCUMENTS

| | | | | |
|---|---|---|---|---|
| 3,147,860 | A * | 9/1964 | Kean, Sr. | B65D 19/08 206/448 |
| 3,511,990 | A * | 5/1970 | Hauss | G03B 42/04 378/187 |
| 3,519,244 | A * | 7/1970 | Lidgard | B65D 85/48 206/583 |
| 3,666,340 | A * | 5/1972 | Albeanese | B65D 85/38 312/283 |
| 3,780,487 | A * | 12/1973 | Munson | F41C 33/06 53/472 |
| 3,939,780 | A * | 2/1976 | Bundy | B60P 3/002 410/38 |
| 4,047,612 | A * | 9/1977 | Lohmann | B65D 85/48 206/454 |
| 4,072,230 | A * | 2/1978 | Mulligan | B65D 85/30 206/454 |
| 4,390,220 | A * | 6/1983 | Benasutti | H05K 7/1069 174/541 |
| 4,422,547 | A * | 12/1983 | Abe | G03F 1/66 206/454 |
| 4,489,835 | A * | 12/1984 | Tombal | B65D 85/48 211/41.14 |
| 4,664,281 | A * | 5/1987 | Falk | H02G 3/088 174/50 |
| 4,832,612 | A * | 5/1989 | Grabbe | H01L 23/4985 206/722 |
| 5,101,976 | A * | 4/1992 | Salisbury | B65D 85/48 206/449 |
| 5,314,068 | A * | 5/1994 | Nakazato | B65D 55/12 206/454 |
| 5,314,159 | A * | 5/1994 | Szarata | A47G 1/1626 206/806 |
| 5,320,225 | A * | 6/1994 | Kirkpatrick | G03F 1/66 53/472 |
| 5,344,334 | A * | 9/1994 | Laub | H05K 7/1061 439/331 |
| 5,353,934 | A * | 10/1994 | Yamauchi | G03F 1/66 206/723 |
| 5,595,301 | A * | 1/1997 | Putz | B65D 25/10 206/449 |
| 5,695,068 | A * | 12/1997 | Hart | B65D 85/38 206/486 |
| 5,743,409 | A * | 4/1998 | Nakahara | H01L 21/67386 206/719 |
| 5,820,116 | A * | 10/1998 | Haese | B25B 5/006 269/95 |
| 5,901,846 | A * | 5/1999 | Betcher | B25H 3/02 206/349 |
| 6,041,937 | A * | 3/2000 | Wu | H01L 21/67369 206/453 |
| 6,050,417 | A * | 4/2000 | Smith | B65D 81/02 206/521 |
| 6,193,195 | B1 * | 2/2001 | Owens | F16L 3/2235 248/68.1 |
| 6,216,873 | B1 * | 4/2001 | Fosnight | G03F 7/70741 206/454 |
| 6,286,684 | B1 * | 9/2001 | Brooks | H01L 21/67369 206/303 |
| 7,080,735 | B2 * | 7/2006 | Allison | B65D 5/5028 206/448 |
| 7,412,792 | B2 * | 8/2008 | Hale | A47G 1/065 40/740 |
| 7,420,655 | B2 * | 9/2008 | Matsutori | G03F 1/66 355/75 |
| 7,530,536 | B2 * | 5/2009 | Hashimoto | F16L 3/237 248/68.1 |
| 7,578,392 | B2 * | 8/2009 | Brooks | H01L 21/67353 206/521 |
| 7,896,046 | B2 * | 3/2011 | Park | B30B 15/068 156/358 |
| 8,118,290 | B2 * | 2/2012 | Thallner | H01L 21/68728 269/21 |
| 8,240,473 | B2 * | 8/2012 | Van Patten | B65D 81/107 206/448 |
| 2014/0183076 | A1 * | 7/2014 | Kolbow | H01L 21/67386 206/454 |
| 2015/0274395 | A1 * | 10/2015 | Smith | B65D 81/133 206/588 |

FOREIGN PATENT DOCUMENTS

| | | |
|---|---|---|
| CN | 204384077 U | 6/2015 |
| CN | 105235987 A | 1/2016 |
| CN | 205150498 U | 4/2016 |
| CN | 206485744 U | 9/2017 |
| CN | 207712652 U | 8/2018 |
| JP | 1081370 A | 3/1998 |

\* cited by examiner

BOX FOR LOADING A FILM AND METHOD FOR LOADING A FILM

CROSS-REFERENCE TO RELATED APPLICATIONS

The present application is based on and claims priority to China Patent Application No. 201811054033.9 filed on Sep. 11, 2018, the disclosure of which is incorporated by reference herein in its entirety.

TECHNICAL FIELD

The present disclosure relates to a box for loading a film and a method for loading a film.

BACKGROUND

In the manufacturing process of a flexible OLED (Organic Light Emitting Diode), after a TFE (Thin Film Encapsulation) structure is formed on a substrate, a layer of film such as TPF (Temporary Protective Film) may be attached on the substrate with the TFE structure to temporarily protect the TFE structure. Further, after PI (Polyimide) is separated from a glass substrate, a layer of film such as BF (Base Film) may be attached on the PI to permanently protect the PI. In the actual production process, a box may be used to load the protective film.

SUMMARY

According to one aspect of embodiments of the present disclosure, a box for loading a film is provided. The box for loading a film comprises: a base provided with a level adjuster; and a lower buffer member supported by the level adjuster.

In some embodiments, the level adjuster comprises a plurality of adjusting members, which pass through the base and support the lower buffer member.

In some embodiments, at least part of the plurality of adjusting members are connected to the lower buffer member.

In some embodiments, at least one of the plurality of adjusting members comprises a screw member.

In some embodiments, the box for loading a film further comprises: a protective cover for use with the base; and an upper buffer member between the protective cover and the lower buffer member.

In some embodiments, the protective cover comprises a top part; and the upper buffer member comprises a first buffer member close to the top part, a second buffer member far from the top part, and a third buffer member between the first buffer member and the second buffer member.

In some embodiments, the third buffer member comprises at least one elastic member, which is connected to the first buffer member and the second buffer member.

In some embodiments, the at least one elastic member comprises a plurality of elastic members, which are uniformly distributed between the first buffer member and the second buffer member.

In some embodiments, the box for loading a film further comprises an operating member through the top part of the protective cover, wherein one end of the operating member is in contact with the upper buffer member.

In some embodiments, the operating member is at a central position of the top part.

In some embodiments, the operating member comprises a rotary knob.

In some embodiments, the box for loading a film further comprises at least one fixed stopper and at least one movable stopper which are on the base and around the lower buffer member.

In some embodiments, the at least one fixed stopper comprises a plurality of fixed stoppers, wherein a part of the plurality of fixed stoppers are on a first side of an edge of the lower buffer member, and another part of the plurality of fixed stoppers are on a second side of the edge of the lower buffer member, the first side being adjacent to the second side; the at least one movable stopper comprises a plurality of movable stoppers, wherein a part of the plurality of movable stoppers are on a third side of the edge of the lower buffer member, the third side being opposite to the first side, and another part of the plurality of movable stoppers are on a fourth side of the edge of the lower buffer member, the fourth side being opposite to the second side.

According to another aspect of embodiments of the present disclosure, a method for loading a film using a box is provided. The box comprises a base provided with a level adjuster, and a lower buffer member supported by the level adjuster. The method comprises: adjusting the level adjuster such that a levelness of the lower buffer member is within an allowable range; and loading the film on the lower buffer member after adjusting the level adjuster.

In some embodiments, the box further comprises a protective cover for use with the base, an upper buffer member between the protective cover and the lower buffer member, and an operating member through a top part of the protective cover, wherein one end of the operating member is in contact with the upper buffer member. The method further comprises: butt jointing the protective cover with the base after loading the film on the lower buffer member; and adjusting the operating member to adjust a positional relationship between the upper buffer member and the film, such that the upper buffer member is in contact with the film.

In some embodiments, the box further comprises at least one fixed stopper and at least one movable stopper which are on the base, wherein the at least one fixed stopper and the at least one movable stopper are around the lower buffer member. The step of loading the film on the lower buffer member comprises: adjusting a position of the at least one movable stopper to a maximum gap position, wherein the maximum gap position is a position of the at least one movable stopper in a case where a gap distance between the at least one movable stopper and a fixed stopper opposite to the at least one movable stopper is maximum; loading the film with a position of the at least one fixed stopper as a reference position, such that an edge of the film is in contact with the at least one fixed stopper; and adjusting a position of the at least one movable stopper such that the at least one movable stopper is in contact with the edge of the film, after the edge of the film being in contact with the at least one fixed stopper.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It is also to be understood that the terms defined in for example general-purpose dictionaries should be construed as having meanings consistent with those in the context of the related art, rather than being construed in an idealized or extremely formalized sense unless explicitly thus defined here.

The techniques, methods, and devices known to a common technical person in the relevant art may not be discussed in detail, but where appropriate, the techniques, methods, and devices should be considered as part of the description.

The inventors of the present disclosure have found that, the bottom of the box in the related art will deform in the process of repeated use of the box. This results in deformation of the protective film due to uneven force after loading the protective film. If the box is aborted in use due to deformation of the box, it will cause waste of resources and result in a high production cost. In the process of the product, the use of a deformed protective film attached to the product may cause warpage of the product. If there is an excessive warpage, the back end process may be affected, so that the product will be discarded directly.

In view of this, the inventors of the present disclosure have proposed a box for loading a film, to prevent deformation of the loaded film resulting from deformation of the bottom of the box as much as possible.

Figure 1:
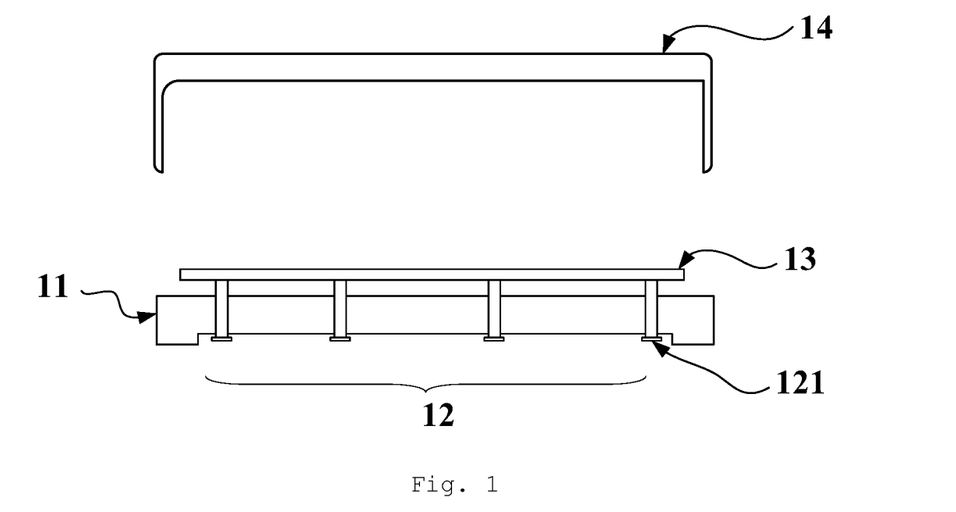
FIG. 1 is a cross-sectional view showing a box for loading a film according to an embodiment of the present disclosure.

FIG. 1 is a cross-sectional view showing a box for loading a film according to an embodiment of the present disclosure. As shown in FIG. 1, the box comprises a base 11 provided with a level adjuster 12 and a lower buffer member 13 supported by the level adjuster 12. The lower buffer member 13 is on the level adjuster 12.

In the process of using the box, the levelness of the lower buffer member 13 may be measured, for example, using a level gauge before loading the film on the lower buffer member. If the levelness is out of an allowable range, the levelness of the lower buffer member 13 may be corrected by adjusting the level adjuster 12, so that the levelness of the lower buffer member 13 is within the allowable range. The film (for example, a protective film) is then loaded on the lower buffer member 13. Thus, even if the base of the box is deformed in the process of repeated use of the box, since the levelness of the lower buffer member is kept within the allowable range, the loaded film may not be deformed due to uneven force. Therefore, by using the box of the above-described embodiment, the deformation of the loaded film resulting from deformation of the bottom of the box may be prevented as much as possible, so that the utilization rate of the box is improved, and the cost is saved.

It should be noted that, the term "levelness" in the embodiments of the present disclosure refers to the degree by which the plane on which the lower buffer member is located deviates from a horizontal plane. In some embodiments of the present disclosure, the allowable range of the levelness may be [−5°, 5°]. Of course, those skilled in the art will appreciate that the allowable range of the levelness here is merely exemplary. The allowable range of the levelness may be determined according to actual conditions, so that the scope of the embodiments of the present disclosure is not only limited thereto.

In some embodiments, as shown in FIG. 1, the level adjuster 12 comprises a plurality of adjusting members 121. The plurality of adjusting members 121 pass through the base 11 and support the lower buffer member 13. For example, the plurality of adjusting members 121 may be uniformly distributed in the base 11, so that the levelness of the lower buffer member is easily adjusted.

In some embodiments, at least part of the plurality of adjusting members 121 are connected to the lower buffer member 13. This makes it possible that the lower buffer member 13 does not easily fall off from the level adjuster, so that it is convenient for use.

In some embodiments, at least one of the plurality of adjusting members 121 may comprise a screw member. For example, each of the adjusting members 121 may comprise a screw member. For example, the screw member may comprise a bolt, a screw, and the like. Of course, those skilled in the art can understand that the adjusting member 121 here may also adopt other structural forms, such as a gear rack, a lead screw, and the like. Therefore, the specific structural form of the adjusting member of the embodiments of the present disclosure is not limited to the screw member described here.

In some embodiments, as shown in FIG. 1, the box further comprises a protective cover 14 for use with the base 11. After the film (for example, the protective film) is loaded on the lower buffer member 13, the protective cover 14 may be used to but joint the base 11. That is, the protective cover 14 is covered on the base 11, so that the film is stored in the box.

Figure 2:
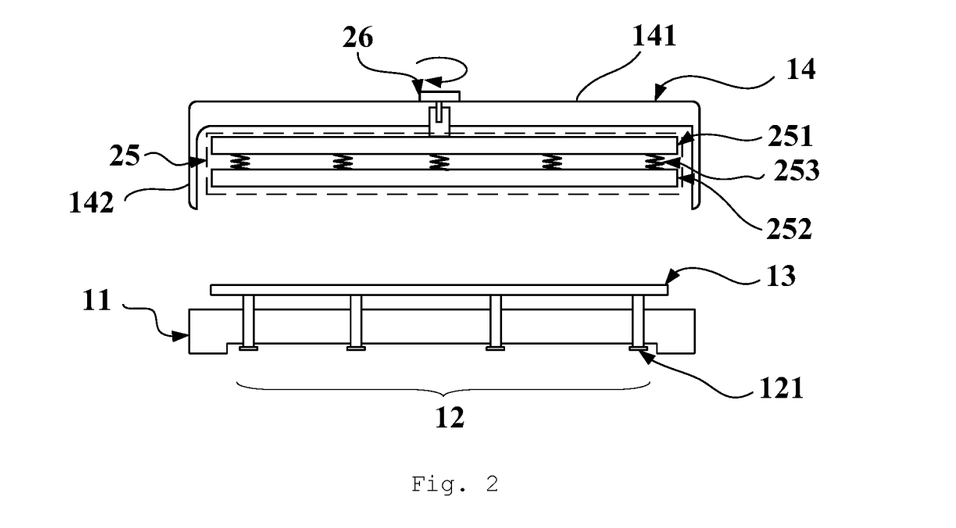
FIG. 2 is a cross-sectional view showing a box for loading a film according to another embodiment of the present disclosure.

FIG. 2 is a cross-sectional view showing a box for loading a film according to another embodiment of the present disclosure. As shown in FIG. 2, the box comprises the base 11, the level adjuster 12, and the lower buffer member 13.

In some embodiments, as shown in FIG. 2, the box further comprises the protective cover 14 for use with the base 11, and an upper buffer member 25 between the protective cover 14 and the lower buffer member 13. In this embodiment, the upper buffer member is provided in the box. Thus, the upper buffer member may be made in contact with the film in the process of loading the film (for example, the protective film), to prevent deformation of the film due to uneven force in the long-time rest process as much as possible.

In some embodiments, as shown in FIG. 2, the protective cover 14 comprises a top part 141. Additionally, the protective cover 14 further comprises a lateral part 142 that is connected to the top part 141 and that surrounds the top part 141.

In some embodiments, as shown in FIG. 2, the upper buffer member 25 comprises a first buffer member 251 close to the top part 141, a second buffer member 252 far from the top part 141, and a third buffer member 253 between the first buffer member 251 and the second buffer member 252. By way of such design, the upper buffer member may be pressed on the film in a buffer manner in the process of loading the film. For example, in the process of loading or transporting the film, due to the presence of the third buffer member, the film may neither be pressed in an excessively loose manner to move nor be pressed in an excessively tight manner to cause damage of the film. Moreover, the problem may also be avoided as much as possible that the film is subjected to uneven force due to the bumping of the box in the transporting process by using the upper buffer member of this embodiment.

In some embodiments, as shown in FIG. 2, the third buffer member 253 comprises at least one elastic member. The at least one elastic member is connected (e.g., fixedly connected) to the first buffer member 251 and the second buffer member 252. For example, the elastic member may be a spring element or an elastic metal sheet and the like. Of course, those skilled in the art should understand that the third buffer member may also adopt other structural forms. For example, the third buffer member may comprises a material layer having elastic properties or the like. Therefore, the scope of embodiments of the present disclosure is not only limited thereto.

In some embodiments, as shown in FIG. 2, the at least one elastic member may comprise a plurality of elastic members. The plurality of elastic members are uniformly distributed between the first buffer member and the second buffer member. In this way, the first buffer member and the second buffer member may be subjected to a relatively uniform force, so that the film is also subjected to a uniform force in the process of loading or transporting the film, which may prevent deformation of the film due to uneven force as much as possible.

It should be noted that the upper buffer member of the embodiments of the present disclosure may also adopt other structural forms. For example, the first buffer member or the second buffer member may be separately provided as an entire upper buffer member. Accordingly, the scope of the embodiments of the present disclosure is not only limited to the structural forms of the upper buffer member disclosed here.

In some embodiments, as shown in FIG. 2, the box further comprises an operating member 26 through the top part 141 of the protective cover 14. One end of the operating member 26 is in contact with the upper buffer member 25. For example, the operating member 26 is in contact with the first buffer member 251 of the upper buffer member 25. By operating the operating member, the upper buffer member 25 may be in contact with the loaded film, so that the loaded film is fixed between the upper buffer member and the lower buffer member.

In some embodiments, as shown in FIG. 2, the operating member 26 is at a central position of the top part 141 of the protective cover 14. In this way, in the process of operating the operating member to make the upper buffer member in contact with the film, the film may be subjected to a uniform force, which may prevent deformation of the film due to uneven force.

In some embodiments, as shown in FIG. 2, the operating member 26 comprises a rotary knob. For example, the upper buffer member may be in contact with the loaded film by rotating the rotary knob. Those skilled in the art should understand that the operating members here may also adopt other structural forms such as a gear rack, a lead screw and the like. Therefore, the scope of the embodiments of the present disclosure is not only limited to the structural forms of the operating member disclosed here.

Figure 3:
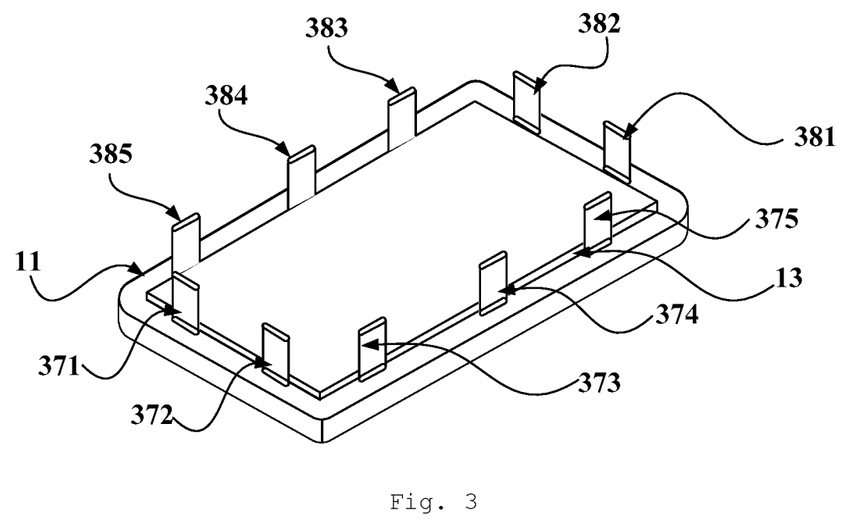
FIG. 3 is a perspective view showing a partial structure of a box for loading a film according to an embodiment of the present disclosure.

FIG. 3 is a perspective view showing a partial structure of a box for loading a film according to an embodiment of the present disclosure. FIG. 3 shows the base 11 and the lower buffer member 13 of the box.

In some embodiments, the box further comprises at least one fixed stopper and at least one movable stopper which are on the base 11. The at least one fixed stopper and the at least one movable stopper are around the lower buffer member 13. For example, FIG. 3 shows five fixed stoppers 371 to 375 and five movable stoppers 381 to 385. The fixed stoppers 371 to 375 and the movable stoppers 381 to 385 are around an edge of the lower buffer member 13.

In some embodiments, the at least one fixed stopper comprises a plurality of fixed stoppers. A part of the plurality of fixed stoppers are on a first side of the edge of the lower buffer member. Another part of the plurality of fixed stoppers are on a second side of the edge of the lower buffer member. The first side is adjacent to the second side. For example, as shown in FIG. 3, the fixed stoppers 371 and 372 are on the first side of the edge of the lower buffer member 13. The fixed stoppers 373, 374 and 375 are on the second side of the edge of the lower buffer member 13. The second side is adjacent to the first side.

In some embodiments, the at least one movable stopper comprises a plurality of movable stoppers. A part of the plurality of movable stoppers are on a third side of the edge of the lower buffer member. The third side is opposite to the first side. Another part of the plurality of movable stoppers are on a fourth side of the edge of the lower buffer member. The fourth side is opposite to the second side. For example, as shown in FIG. 3, the movable stoppers 381 and 382 are on the third side of the edge of the lower buffer member 13. The third side is opposite to the first side. For example, the movable stopper 381 is disposed opposite to the fixed stopper 372, and the movable stopper 382 is disposed opposite to the fixed stopper 371. The movable stoppers 383, 384, and 385 are on the fourth side of the edge of the lower buffer member 13. The fourth side is opposite to the second side. For example, the movable stopper 383 is disposed opposite to the fixed stopper 375, the movable stopper 384 is disposed opposite to the fixed stopper 374, and the movable stopper 385 is disposed opposite to the fixed stopper 373.

In the above-described embodiment, the fixed stoppers 371 to 375 are fixed, the positions of which are as a reference position for the film (e.g., the protective film) in the box. The movable stopper may move integrally on the surface of the base in a direction away from or close to the fixed stopper opposite to the movable stopper. The positions of the movable stoppers 381 to 385 may be adjusted to a maximum gap position before the film is loaded. Here, the maximum gap position is a position of the movable stopper in a case where a gap distance between the movable stopper and a fixed stopper opposite to the movable stopper is maximum (i.e., the maximum distance that can be achieved). In the process of loading the film, the positions of the fixed stoppers 371 to 375 are taken as the reference position, and the edge of the film is made to be in contact with the fixed stoppers. The movable stoppers 381-385 are then adjusted such that the movable stoppers are in contact with the edge of the film so that it is possible to produce the effect of fixing a position of the film.

It should be noted that, the quantities of the fixed stoppers and the movable stoppers of the embodiments of the present disclosure are not only limited to the quantities disclosed herein. The quantities of the fixed stoppers and the movable stoppers may be determined according to actual needs. For example, the quantity of the fixed stoppers may be 2, 3, 4, 6 or more, and the quantity of the movable stoppers may be 2, 3, 4, 6 or more.

It should also be noted that the positions of the fixed stoppers and the movable stoppers of the embodiments of the present disclosure are not only limited to the positions disclosed here. For example, a part of the fixed stoppers may be disposed on the first side of the edge of the lower buffer member 13, and another part of the fixed stoppers may be disposed on the third side of the edge of the lower buffer member 13. For another example, a part of the movable stoppers may be disposed on the second side of the edge of the lower buffer member 13, and another part of the movable stoppers may be disposed on the fourth side of the edge of the lower buffer member 13. The positions of the fixed stoppers and the movable stoppers may be determined according to actual needs.

Figure 4:
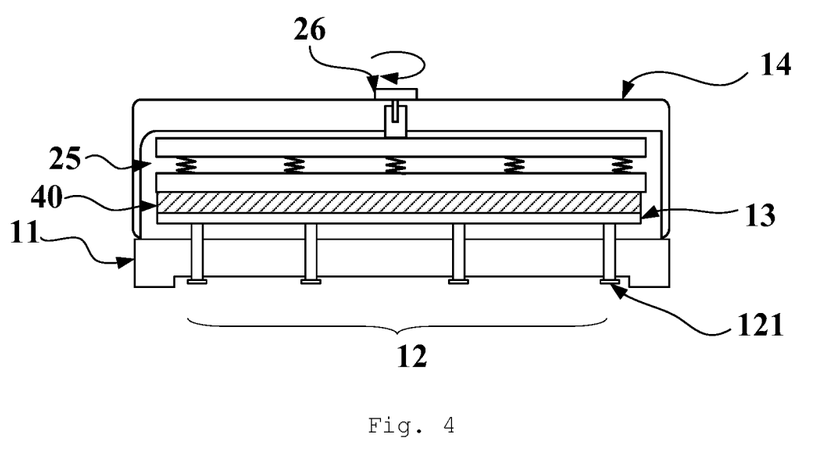
FIG. 4 is a cross-sectional view showing a loaded film and a box for loading the film according to an embodiment of the present disclosure.

FIG. 4 is a cross-sectional view showing a loaded film and a box for loading the film according to an embodiment of the present disclosure. As shown in FIG. 4, in the process of loading the film (e.g., the protective film) 40, the level adjuster 12 may be adjusted such that the levelness of the lower buffer member 13 is within an allowable range. The film 40 is then loaded on the lower buffer member 13. Next, the protective cover 14 of the box is covered on the base 11. Then, the positional relationship between the upper buffer member 25 and the film 40 is adjusted by adjusting the operating member (e.g., the rotary knob) 26, thereby ensuring that the upper buffer member 25 and the lower buffer member 13 are respectively in sufficient contact with the film 40, so that it is possible to prevent deformation of the film due to uneven force in the long-time rest process as much as possible.

Figure 5:
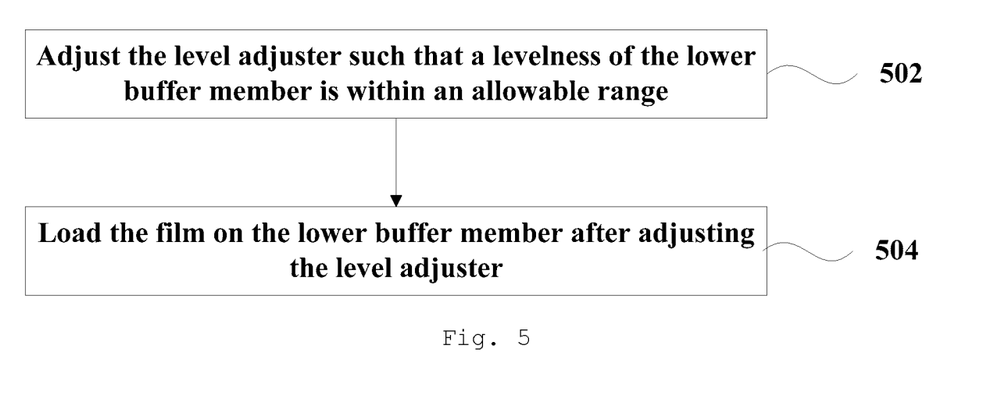
FIG. 5 is a flow chart showing a method for loading a film using a box for loading a film according to an embodiment of the present disclosure.

FIG. 5 is a flow chart showing a method for loading a film using a box for loading a film according to an embodiment of the present disclosure. The box comprises a base provided with a level adjuster, and a lower buffer member supported by the level adjuster. As shown in FIG. 5, the method comprises steps S502 to S504.

In step S502, the level adjuster is adjusted such that a levelness of the lower buffer member is within an allowable range.

For example, the base may be deformed in the process of repeated use of the box. The levelness of the lower buffer member may be measured using a level gauge before loading the film (e.g. the protective film). If the levelness of the lower buffer member is out of the allowable range, the levelness of the lower buffer member may be corrected by adjusting the level adjuster, so that the levelness of the lower buffer member is within the allowable range.

At step S504, the film is loaded on the lower buffer member after adjusting the level adjuster.

For example, the box further comprises at least one fixed stopper and at least one movable stopper which are on the base. The at least one fixed stopper and the at least one movable stopper are around the lower buffer member.

In some embodiments, the step S504 may comprise adjusting a position of the at least one movable stopper to a maximum gap position. The maximum gap position is a position of the at least one movable stopper in a case where a gap distance between the at least one movable stopper and a fixed stopper opposite to the at least one movable stopper is maximum. The step S504 may further comprise loading the film with a position of the at least one fixed stopper as a reference position, such that an edge of the film is in contact with the at least one fixed stopper. The step S504 may further comprise adjusting a position of the at least one movable stopper such that the at least one movable stopper is in contact with the edge of the film, after the edge of the film being in contact with the at least one fixed stopper.

Hitherto, a method for loading a film according to some embodiments of the present disclosure is provided. In the method, the level adjuster is adjusted such that the levelness of the lower buffer member is within an allowable range. The film is loaded on the lower buffer member after adjusting the level adjuster. In the process, since the levelness of the lower buffer member may be kept within the allowable range, the loaded film may not be deformed due to uneven force. Therefore, the deformation of the loaded film resulting from deformation of the bottom of the box may be prevented as much as possible.

In some embodiments, the box further comprises a protective cover for use with the base, an upper buffer member between the protective cover and the lower buffer member, and an operating member through the top part of the protective cover. One end of the operating member is in contact with the upper buffer member. The method may also comprises butt jointing the protective cover with the base after loading the film. The method may further comprise adjusting the operating member to adjust a positional relationship between the upper buffer member and the film, such that the upper buffer member is in contact with the film. In this embodiment, after the protective cover and the base of the box are butt jointed, the positional relationship between the upper buffer member and the film is adjusted by adjusting the operating member, thereby ensuring that the upper buffer member and the lower buffer member are respectively in sufficient contact with the film, so that it is possible to prevent deformation of the film due to uneven force in the long-time rest process as much as possible.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the disclosure is defined by the following claims.

What is claimed is:

1. A box for loading a protective film used in a process of manufacturing a flexible organic light emitting diode display panel, comprising:
   a base provided with a level adjuster;
   a lower buffer member supported by the level adjuster;
   a protective cover for use with the base, the protective cover comprising a top part; and
   an upper buffer member between the protective cover and the lower buffer member, the upper buffer member comprising a first buffer member close to the top part, a second buffer member far from the top part, and a third buffer member between the first buffer member and the second buffer member,
   wherein the level adjuster comprises a plurality of adjusting members, which pass through the base and support the lower buffer member, and the plurality of adjusting members are connected to the lower buffer member and not connected to the upper buffer member.

2. The box for loading a film according to claim 1, wherein
   at least part of the plurality of adjusting members are connected to the lower buffer member.

3. The box for loading a film according to claim 1, wherein
   at least one of the plurality of adjusting members comprises a screw member.

4. The box for loading a film according to claim 1, wherein
   the third buffer member comprises at least one elastic member, which is connected to the first buffer member and the second buffer member.

5. The box for loading a film according to claim 4, wherein
   the at least one elastic member comprises a plurality of elastic members, which are uniformly distributed between the first buffer member and the second buffer member.

6. The box for loading a film according to claim 1, further comprising:
   an operating member through the top part of the protective cover, wherein one end of the operating member is in contact with the upper buffer member.

7. The box for loading a film according to claim 6, wherein
   the operating member is at a central position of the top part.

8. The box for loading a film according to claim 6, wherein
   the operating member comprises a rotary knob.

9. The box for loading a film according to claim 1, further comprising:
   at least one fixed stopper and at least one movable stopper which are on the base and around the lower buffer member.

10. The box for loading a film according to claim 9, wherein
    the at least one fixed stopper comprises a plurality of fixed stoppers, wherein a part of the plurality of fixed stoppers are on a first side of an edge of the lower buffer member, and another part of the plurality of fixed stoppers are on a second side of the edge of the lower buffer member, the first side being adjacent to the second side;
    the at least one movable stopper comprises a plurality of movable stoppers, wherein a part of the plurality of movable stoppers are on a third side of the edge of the lower buffer member, the third side being opposite to the first side, and another part of the plurality of movable stoppers are on a fourth side of the edge of the lower buffer member, the fourth side being opposite to the second side.

11. A method for loading a film using a box for loading a protective film used in a process of manufacturing a flexible organic light emitting diode display panel, which comprises a base provided with a level adjuster, and a lower buffer member supported by the level adjuster, a protective cover for use with the base, the protective cover comprising a top part, and an upper buffer member between the protective cover and the lower buffer member, the upper buffer member comprising a first buffer member close to the top part, a second buffer member far from the top part, and a third buffer member between the first buffer member and the second buffer member, wherein the level adjuster comprises a plurality of adjusting members, which pass through the base and support the lower buffer member, and the plurality of adjusting members are connected to the lower buffer member and not connected to the upper buffer member, comprising:
    adjusting the level adjuster such that a levelness of the lower buffer member is within an allowable range, the allowable range is [−5°, 5°]; and
    loading the film on the lower buffer member after adjusting the level adjuster.

12. The method according to claim 11, wherein
    the box further comprises an operating member through a top part of the protective cover, wherein one end of the operating member is in contact with the upper buffer member;
    the method further comprising:
    butt jointing the protective cover with the base after loading the film on the lower buffer member; and adjusting the operating member to adjust a positional relationship between the upper buffer member and the film, such that the upper buffer member is in contact with the film.

13. The method according to claim 11, wherein the box further comprises at least one fixed stopper and at least one movable stopper which are on the base, wherein the at least one fixed stopper and the at least one movable stopper are around the lower buffer member;

wherein loading the film on the lower buffer member comprises:

adjusting a position of the at least one movable stopper to a maximum gap position, wherein the maximum gap position is a position of the at least one movable stopper in a case where a gap distance between the at least one movable stopper and a fixed stopper opposite to the at least one movable stopper is maximum;

loading the film with a position of the at least one fixed stopper as a reference position, such that an edge of the film is in contact with the at least one fixed stopper; and adjusting a position of the at least one movable stopper such that the at least one movable stopper is in contact with the edge of the film, after the edge of the film being in contact with the at least one fixed stopper.

* * * * *